(12) United States Patent
Darnon et al.

(10) Patent No.: US 8,298,937 B2
(45) Date of Patent: Oct. 30, 2012

(54) INTERCONNECT STRUCTURE FABRICATED WITHOUT DRY PLASMA ETCH PROCESSING

(75) Inventors: Maxime Darnon, Yorktown Heights, NY (US); Jeffrey P. Gambino, Essex Junction, VT (US); Elbert E. Huang, Yorktown Heights, NY (US); Qinghuang Lin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 573 days.

(21) Appl. No.: 12/483,588

(22) Filed: Jun. 12, 2009

(65) Prior Publication Data

US 2010/0314768 A1    Dec. 16, 2010

(51) Int. Cl.
H01L 21/44 (2006.01)
(52) U.S. Cl. .............................. 438/652; 257/E21.584
(58) Field of Classification Search .............. 438/652, 438/629, 636–640, 645, 667, 672, 675; 257/E23.168, E21.584
See application file for complete search history.

(56) References Cited

U.S. PATENT DOCUMENTS

| | | |
|---|---|---|
| 4,371,605 A | 2/1983 | Renner |
| 4,910,122 A | 3/1990 | Arnold et al. |
| 5,695,810 A | 12/1997 | Dubin et al. |
| 6,087,064 A | 7/2000 | Lin et al. |
| 6,133,143 A | 10/2000 | Lin et al. |
| 6,348,406 B1 | 2/2002 | Subramanian et al. |
| 6,635,583 B2 | 10/2003 | Bencher et al. |
| 6,893,684 B2 | 5/2005 | Puligadda et al. |
| 7,008,871 B2 | 3/2006 | Andricacos et al. |
| 7,041,748 B2 | 5/2006 | Lin et al. |
| 7,056,840 B2 | 6/2006 | Miller et al. |
| 7,566,975 B2 * | 7/2009 | Motoyama .................. 257/762 |
| 2002/0012876 A1 | 1/2002 | Angelopoulos et al. |
| 2005/0093158 A1 | 5/2005 | Liu et al. |
| 2006/0105181 A1 | 5/2006 | Lin et al. |
| 2007/0097514 A1 | 5/2007 | Matsuzawa et al. |
| 2008/0176396 A1 * | 7/2008 | Futase et al. .................. 438/652 |
| 2009/0050872 A1 * | 2/2009 | Kuo et al. ......................... 257/3 |
| 2009/0079076 A1 | 3/2009 | Lin et al. |

* cited by examiner

*Primary Examiner* — Hoa B Trinh
(74) *Attorney, Agent, or Firm* — Scully, Scott, Murphy & Presser, P.C.; Louis J. Percello, Esq.

(57) ABSTRACT

An interconnect structure within a microelectronic structure and a method for fabricating the interconnect structure within the microelectronic structure use a developable bottom anti-reflective coating layer and at least one imageable inter-level dielectric layer located thereupon over a substrate that includes a base dielectric layer and a first conductor layer located and formed embedded within the base dielectric layer. Incident to use of the developable bottom anti-reflective coating layer and the at least one imageable inter-level dielectric layer, an aperture, such as but not limited to a dual damascene aperture, may be formed through the at least one imageable inter-level dielectric layer and the developable anti-reflective coating layer to expose a capping layer located and formed upon the first conductor layer, absent use of a dry plasma etch method when forming the interconnect structure within the microelectronic structure.

16 Claims, 2 Drawing Sheets

INTERCONNECT STRUCTURE FABRICATED WITHOUT DRY PLASMA ETCH PROCESSING

BACKGROUND

The invention relates generally to interconnect structures within microelectronic structures. More particularly, the invention relates to methods for efficiently fabricating interconnect structures within microelectronic structures.

Microelectronic structures, such as but not limited to semiconductor structures, are typically fabricated using microelectronic substrates within, upon and/or over which are located and formed microelectronic devices. The microelectronic devices are connected and interconnected using patterned conductor layers that are separated by dielectric layers. Such sub-structures that comprise such patterned conductor layers that are separated by dielectric layers within microelectronic structures are conventionally understood within the microelectronic fabrication art as interconnect structures.

As microelectronic fabrication technology has advanced, the complexity of interconnect structures has also increased. Thus, interconnect structures within microelectronic structures typically comprise several interconnecting patterned conductor layers that are separated by dielectric layers that are interposed between the several interconnecting patterned conductor layers. In order to provide for optimal performance of interconnect structures, patterned conductor layers within interconnect structures typically comprise copper containing conductor materials that provide for enhanced microelectronic circuit speed, while dielectric layers within interconnect structures typically comprise comparatively low dielectric constant dielectric materials (i.e., having a dielectric constant from 1.0 to 4.3) that provide for reduced cross-talk between adjacent patterned conductor layers within an interconnect structure.

While copper containing conductor materials and comparatively low dielectric constant dielectric materials are thus desirable within the microelectronic fabrication art for fabricating interconnect structures with enhanced performance, copper containing conductor materials and low dielectric constant dielectric materials are nonetheless not entirely without problems in the microelectronic fabrication art for fabricating interconnect structures with enhanced performance. In that regard, a density of patterned conductor layers within an interconnect structure may provide for reflective based processing difficulties within an interconnect structure when fabricating an overlying patterned conductor layer within the interconnect structure. In addition, low dielectric constant dielectric materials are also often difficult to effectively and reproducibly pattern absent damage while using conventional dry plasma etch methods.

Thus, desirable are interconnect structures within microelectronic structures and methods for fabricating interconnect structures within microelectronic structures that provide for readily fabricated interconnect structures with enhanced interconnect structure performance.

BRIEF SUMMARY

In one embodiment of the invention, an interconnect structure within a microelectronic structure and a method for efficiently fabricating the interconnect structure within the microelectronic structure are provided.

The interconnect structure in accordance with an embodiment of the invention first includes a substrate that further includes a first conductor layer located embedded within a base dielectric layer located over the substrate, and optionally also includes a first self-aligned capping layer located aligned upon the first conductor layer. The interconnect structure also includes, sequentially layered upon the foregoing intermediate structure: (1) a patterned bottom anti-reflective coating layer located upon the foregoing intermediate structure; and (2) at least one patterned inter-level dielectric layer located upon the patterned bottom anti-reflective coating layer. The patterned bottom anti-reflective coating layer and the at least one patterned inter-level dielectric layer define an aperture over the first conductor layer. Each of the patterned bottom anti-reflective coating layer and the patterned inter-level dielectric layer has a particular material composition.

The particular method for fabricating the interconnect structure mentioned above sequentially forms: (1) the first self-aligned capping layer self-aligned to the first conductor layer formed over the substrate; (2) a developable but not imageable bottom anti-reflective coating layer that may be developed to form the patterned bottom anti-reflective coating layer; and (3) at least one imageable inter-level dielectric layer that may be imaged and developed to form the patterned inter-level dielectric layer. The imageable inter-level dielectric layer is sequentially imaged and developed, and the developable bottom anti-reflective coating layer is sequentially developed, to form the patterned bottom anti-reflective coating layer and the patterned inter-level dielectric layer that provide the aperture over the first conductor layer.

No dry plasma etch processing is used for forming the first self-aligned capping layer, the patterned bottom anti-reflective coating layer or the at least one patterned inter-level dielectric layer. Thus, the interconnect structure may be fabricated efficiently absent dry plasma etch processing damage to the patterned inter-level dielectric layer, that may comprise a comparatively low dielectric constant dielectric material (i.e., having a dielectric constant from 1.0 to 4.3, measured in vacuum).

A particular microelectronic structure that includes an interconnect structure in accordance with an embodiment of the invention includes: (1) a first conductor layer located within a base dielectric layer located over a substrate; (2) a patterned bottom antireflective coating layer located upon the base dielectric layer; and (3) at least one patterned inter-level dielectric layer located upon the patterned bottom anti-reflective coating layer. The patterned bottom anti-reflective coating layer and the at least one patterned inter-level dielectric layer define an aperture located over the first conductor layer. The patterned bottom anti-reflective coating layer includes an element selected from the group consisting of C, Si, Ge, B, Sn, Fe, Ta, Ti, Ni, Hf and La. The at least one patterned inter-level dielectric layer comprises a cured organic functionalized silicon containing dielectric material.

Another particular microelectronic structure that includes an interconnect structure in accordance with an embodiment of the invention includes: (1) a first conductor layer located within a base dielectric layer located over a substrate; (2) a first conductor capping layer located aligned upon the first conductor layer; (3) a patterned bottom anti-reflective coating layer located upon the base dielectric layer; and (4) at least one patterned inter-level dielectric layer located upon the patterned bottom anti-reflective coating layer. The patterned bottom anti-reflective coating layer and the at least one patterned inter-level dielectric layer define an aperture that exposes the first conductor capping layer. The developed bottom anti-reflective coating layer includes an element selected from the group consisting of C, Si, Ge, B, Sn, Fe, Ta, Ti, Ni, Hf and La. The at least one patterned inter-level dielectric layer comprises an organic functionalized silicon containing dielectric material.

A particular method for fabricating a microelectronic structure that includes an interconnect structure in accordance with an embodiment of the invention includes forming over a substrate that includes a first conductor layer formed within a base dielectric layer a developable but not imageable bottom anti-reflective coating layer. This particular method also includes forming upon the developable but not imageable anti-reflective coating layer at least one imageable inter-level dielectric layer. This particular method also includes imaging and developing the imageable inter-level dielectric layer and developing the developable but not imageable bottom anti-reflective coating layer to form a patterned inter-level dielectric layer formed upon a patterned bottom anti-reflective coating layer that defines an aperture located over the first conductor layer.

Another particular method for fabricating a microelectronic structure that includes an interconnect structure in accordance with an embodiment of the invention includes forming self-aligned upon a first conductor layer formed within a base dielectric layer formed over a substrate a first capping layer. This particular method also includes forming over the substrate that includes the first capping layer formed upon the first conductor layer formed within the base dielectric layer a developable but not imageable bottom anti-reflective coating layer. This particular method also includes forming upon the developable but not imageable bottom anti-reflective coating layer at least one imageable inter-level dielectric layer. This particular method also includes imaging and developing the at least one imageable inter-level dielectric layer and developing the developable but not imageable bottom anti-reflective coating layer to form a patterned inter-level dielectric layer formed upon a patterned bottom anti-reflective coating layer that defines an aperture located over the first conductor layer.

BRIEF DESCRIPTION OF THE SEVERAL VIEWS OF THE DRAWINGS

FIG. 1 shows the microelectronic structure at an early stage in the fabrication therein of the interconnect structure.

FIG. 2 shows a first self-aligned capping layer located and formed upon a first conductor layer within the interconnect structure within the microelectronic structure of FIG. 1.

FIG. 3 shows a developable bottom anti-reflective coating layer located and formed upon the microelectronic structure of FIG. 2, and an imageable inter-level dielectric layer located and formed upon the developable bottom anti-reflective coating layer.

FIG. 4 shows the results of imaging and developing the imageable inter-level dielectric layer and developing the developable bottom anti-reflective coating layer within the microelectronic structure of FIG. 3 to provide a damascene aperture that is bounded by a patterned bottom anti-reflective coating layer and a patterned inter-level dielectric layer.

FIG. 5 shows a second imageable inter-level dielectric layer located and formed upon the microelectronic structure of FIG. 4.

FIG. 6 shows the results of imaging and developing the second imageable inter-level dielectric layer within the microelectronic structure of FIG. 5 to provide a dual damascene aperture that is bounded by the patterned anti-reflective coating layer, the patterned first inter-level dielectric layer and a patterned second inter-level dielectric layer.

FIG. 7 shows a second conductor layer comprising a contiguous via and interconnect located and formed into the dual damascene aperture that is illustrated within the microelectronic structure of FIG. 6.

DETAILED DESCRIPTION

Figure 1:
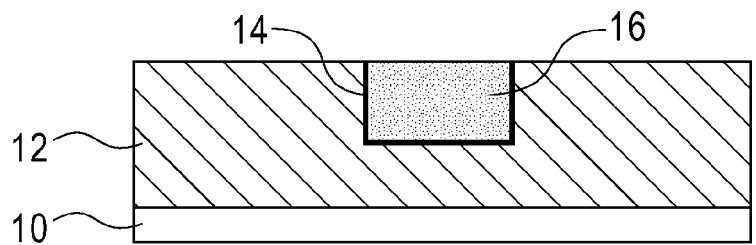
FIG. 1 to FIG. 7 show a series of schematic cross-sectional diagrams illustrating the results of progressive stages in fabricating a microelectronic structure that includes an interconnect structure in accordance with a particular embodiment of the invention.

The invention, which comprises an interconnect structure that may be readily fabricated within a microelectronic structure absent dry plasma etch processing, and a method for readily fabricating the interconnect structure within the microelectronic structure absent the dry plasma etch processing, is understood within the context of the Description of the Preferred Embodiment, as set forth below. The Description of the Preferred Embodiment is understood within the context of the drawing that are described above. Since the drawings are intended for illustrative purposes, the drawings are not necessarily drawn to scale.

FIG. 1 to FIG. 7 show a series of schematic cross-sectional diagrams illustrating the results of progressive stages in fabricating an interconnect structure within a microelectronic structure in accordance with a particular embodiment of the invention.

FIG. 1 shows a substrate 10. A base dielectric layer 12 is located and formed upon the substrate 10. A first barrier layer 14 is located and formed embedded within the base dielectric layer 12 and a first conductor layer 16 is also located and formed embedded within the base dielectric layer 12 and separated from the base dielectric layer 12 by the barrier layer 14.

Each of the foregoing substrate 10 and overlying layers 12/14/16 may comprise materials and have dimensions that are otherwise generally conventional in the microelectronic fabrication art, and in particular the semiconductor fabrication art. Each of the foregoing substrate 10 and overlying layers 12/14/16 may also be formed using methods that are otherwise generally conventional in the microelectronic fabrication art, and in particular the semiconductor fabrication art.

The substrate 10 may comprise any type of substrate that may be used as a base substrate in fabricating a microelectronic structure. Thus, particular substrates that may be used for the substrate 10 include dielectric substrates (i.e., such as but not limited to ceramic substrates and glass-ceramic substrates) and semiconductor substrates. When the substrate 10 comprises a semiconductor substrate, such a semiconductor substrate may comprise any of several semiconductor materials. Non-limiting examples of semiconductor materials include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the substrate 10 comprises a silicon or silicon-germanium alloy semiconductor material that has a thickness from 0.1 to 1 millimeters.

Although FIG. 1 implicitly illustrates this particular embodiment within the context of a bulk semiconductor substrate comprising the substrate 10, this particular embodiment is not intended to be so limited. Rather, this instant particular embodiment and alternative embodiments may also be practiced under certain circumstances using a semiconductor-on-insulator substrate (that would otherwise result from the presence of a buried dielectric layer interposed within a thickness of a bulk semiconductor substrate). Alternatively, this particular embodiment also contemplates use of a hybrid orientation (HOT) substrate for the substrate 10 when the substrate 10 comprises a semiconductor substrate. A hybrid orientation substrate includes multiple crystallographic orientation semiconductor regions supported by a single semiconductor substrate.

Although not particularly illustrated within the schematic cross-sectional diagram of FIG. 1, when the substrate 10 comprises a semiconductor substrate, the semiconductor substrate will typically include located and formed therein and/or thereupon microelectronic devices, such as but not limited to semiconductor devices. Such microelectronic devise may include, but are not necessarily limited to, resistors, transistors, diodes and capacitors that may be connected and interconnected using an interconnect structure in accordance with the embodiment and the invention.

The base dielectric layer 12 comprises a dielectric material. Suitable dielectric materials include, but are not necessarily limited to, comparatively higher dielectric constant dielectric materials (i.e., having a dielectric constant greater than 4.3 to 20, measured in vacuum), such as but not limited to silicon oxide dielectric materials, silicon nitride dielectric materials and silicon oxynitride dielectric materials (i.e., although oxides, nitrides and oxynitrides of other elements are not excluded). Also included, but also not limiting, are generally lower dielectric constant dielectric materials (i.e., having a dielectric constant from 1.0 to less than 4.3, measured in vacuum), such as but not limited to spin-on-glass dielectric materials, spin-on-polymer dielectric materials, micro-porous dielectric materials, nano-porous dielectric materials, carbon doped silicate glass dielectric materials and fluorine doped silicate glass dielectric materials.

Either one of the foregoing generally higher dielectric constant dielectric materials and generally lower dielectric constant dielectric materials may be fabricated using methods and materials that are otherwise generally conventional in the microelectronic fabrication art. Included in particular, but also not limiting, are spin-on methods, chemical vapor deposition methods and physical vapor deposition methods. Typically, the base dielectric layer 12 comprises at least in-part a silicon oxide material, that may comprise a generally lower dielectric constant dielectric material, that has a thickness from 50 to 2000 nanometers.

The first barrier layer 14 comprises a barrier material. Suitable barrier materials include, but are not necessarily limited to conductor barrier materials and dielectric barrier materials. Conductor barrier materials are generally more common, although dielectric barrier materials are also known.

Conductor barrier materials that may be used for forming the barrier layer 14 include, but are not necessarily limited to titanium, tantalum, ruthenium and tungsten conductor barrier materials, alloys of titanium, tantalum, ruthenium and tungsten conductor barrier materials and nitrides of titanium, tantalum, ruthenium and tungsten conductor barrier materials, as well as laminates and composites of any of the foregoing conductor barrier materials. Any of the foregoing conductor barrier materials may be formed using methods that are otherwise generally conventional in the microelectronic fabrication art. Such methods may include, but are not necessarily limited to, thermal or plasma nitridation methods, chemical vapor deposition methods (i.e., including but not limited to atomic layer deposition methods) and physical vapor deposition methods. Typically, the barrier layer 14 comprises a titanium or tantalum conductor barrier material or a nitride of a titanium, tantalum or tungsten conductor barrier material, that has a conformal thickness (i.e., a single thickness) from 1 to 100 nanometers located and formed embedded within the base dielectric layer 12.

The conductor layer 16 comprises a conductor material. Aluminum, copper and tungsten containing conductor materials are common conductor materials within the microelectronic fabrication art, and more particularly within the semiconductor fabrication art. Also included, but also not limiting, are alloys of the foregoing conductor materials. The foregoing conductor materials may in general be formed using methods and materials analogous, equivalent or identical to the methods and materials that are used for forming the barrier layer 14 when comprised of a conductor barrier material. Also included are plating methods for forming the conductor layer 16. Typically, the conductor layer 16 comprises a copper or copper containing conductor material that has a thickness from 25 to 1000 nanometers located and formed upon the barrier layer 14 as embedded within the base dielectric layer 12.

Although not a limitation of this particular embodiment of the invention, the microelectronic structure of FIG. 1 may in a first instance be fabricated by forming a precursor layer to the base dielectric layer 12 upon the substrate 10. Such a precursor layer to the base dielectric layer 12 may then be etched to provide an aperture into which is located and formed a blanket first barrier layer precursor to the first barrier layer 14 and a blanket first conductor layer precursor to the first conductor layer 16. Such a blanket first barrier layer precursor may be formed using a method such as but not limited to a chemical vapor deposition method or a physical vapor deposition method. Such a blanket first conductor layer precursor may be formed using a plating method. The blanket first conductor layer precursor and the blanket first barrier layer precursor may then be sequentially planarized to provide the first conductor layer 16 located and formed nested within the first barrier layer 14 located and formed within the aperture. Such planarizing may be effected using planarizing methods that are otherwise generally conventional in the microelectronic fabrication art. Mechanical planarizing methods and chemical mechanical polish planarizing methods are common.

Figure 2:
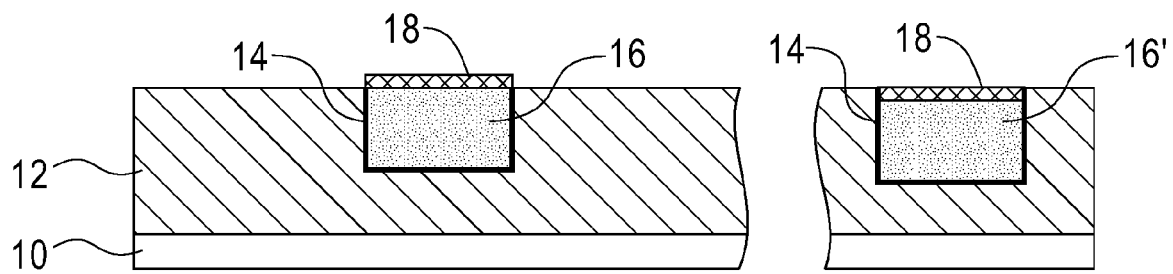

FIG. 2 shows a self-aligned capping layer 18 located and formed aligned upon (i.e., aerially co-extensive with in plan-view) and capping the first conductor layer 16 within the microelectronic structure of FIG. 1.

Within this particular embodiment, the self-aligned capping layer 18 comprises a conductor capping material that can be located and formed by selective deposition upon a copper conductor material or a copper containing conductor material from which the first conductor layer 16 is preferably comprised, and not on the dielectric material from which the base dielectric layer 12 is comprised. Particular conductor capping materials that are contemplated within the instant embodiment that may be selectively deposited to form the self-aligned capping layer 18 include, but are not necessarily limited to, stoichiometric and non-stoichiometric alloys of CoWP, CoWB, CuSiN, NiMoP, CoWMoB and CoWPB. Such conductor capping materials may be formed selectively self-aligned with respect to the first conductor layer 16 while using methods including but not limited to plating methods. Typically, the self-aligned capping layer 18 is located and formed upon the first conductor layer 16 to a thickness from 1 to 10 nanometers.

Although the left hand side of FIG. 2 illustrates the embodiment within the context of a self-aligned capping layer 18 that is located and formed upon the first conductor layer 16 that is planarized with respect to the base dielectric layer 12, alternatively, the embodiment also contemplates that the first conductor layer 16 may be embedded within and recessed within the base dielectric layer 12, and thus the self-aligned capping layer 18 located and formed planarized with respect to the base dielectric layer 12. Such an alternative of this first embodiment is illustrated within the right hand side of FIG. 2, which includes the first conductor layer 16' that is embedded within and recessed within the base dielectric layer 12. Under such circumstances, the embodiment also contemplates that the self-aligned capping layer 18 may be formed of a non-selectively blanket deposited conductor capping material or dielectric capping material that is subsequently planarized to provide the embedded and recessed self-aligned capping layer 18. Such non-selectively deposited conductor capping materials may include, but are not necessarily limited to conductor materials that are analogous, equivalent or identical to the conductor barrier materials from which may be comprised the first barrier layer 14. Such non-selectively deposited dielectric barrier materials may include, but are not necessarily limited to, dielectric materials that are analogous, equivalent or identical to the dielectric materials from which may be comprised the base dielectric layer 12.

Figure 3:
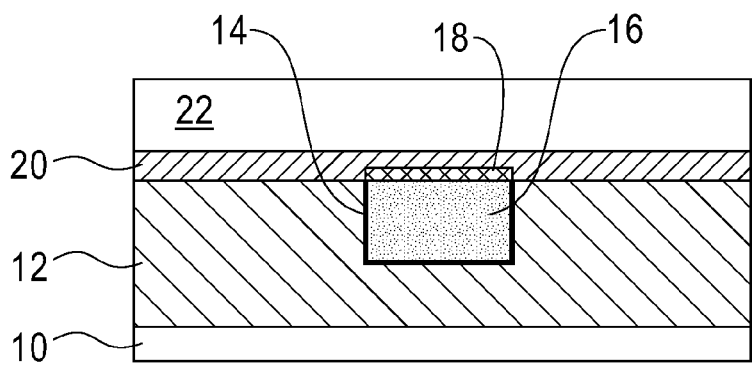

FIG. 3 shows a developable bottom anti-reflective coating layer 20 located and formed upon the microelectronic structure of FIG. 2. FIG. 3 also shows a first imageable inter-level dielectric layer 22 located and formed upon the developable bottom anti-reflective coating layer 20.

Similarly with other bottom anti-reflective coating materials that are generally known in the microelectronic fabrication art, a developable bottom anti-reflective coating material in accordance with this particular embodiment comprises an organic liquid coating material that is typically intended to be used in conjunction with an overlying photoresist material layer during a photolithographic process step incident to fabrication of a microelectronic structure. Distinguishing the developable bottom anti reflective coating layer 20 in accordance with the instant embodiment from an otherwise generally conventional bottom anti-reflective coating layer is the characteristic that the developable bottom anti-reflective coating layer 20 may be developed sequentially with development of a resist layer that is located and formed upon the developable bottom anti-reflective coating layer 20. Thus, the developable bottom anti-reflective coating layer 20 in accordance with this particular embodiment serves as a generally conventional bottom anti-reflective coating layer. As will be illustrated within the context of further discussion below, a developed developable bottom anti-reflective coating layer 20 in accordance with the embodiment will remain in place as a patterned bottom anti-reflective coating and thus also serve in-part as a portion of an inter-level dielectric layer incident to further processing of the microelectronic structure whose schematic cross-sectional diagram is illustrated in FIG. 3. Typically, the developable bottom anti-reflective coating layer 20 has a thickness from 5 to 200 nanometers, and the developable bottom anti-reflective coating layer 20 is not intended to have imageable properties, although under certain circumstances the developable anti-reflective coating material may have imageable properties.

The imageable inter-level dielectric layer 22 comprises an imageable inter-level dielectric material. Within the context of further discussion below, the imageable inter-level dielectric layer 22 typically comprises a functionalized polymer having one or more acid-sensitive functional groups that impart imageability to the imageable inter-level dielectric layer 22. Within the context of the instant embodiment, such a functionalized polymer may be imaged and developed (i.e., patterned) using photolithographic methods, and desirably may be converted into a low dielectric constant patterned inter-level dielectric layer polymer after subsequent processing, that may include, but is not necessarily limited to, thermal processing or radiation processing.

Within the context of the instant embodiment, the developable bottom anti-reflective coating layer 20 is typically, but not necessarily, formed by a liquid deposition process including but not limited to spin-on coating, spray coating, dip coating, brush coating, evaporation or chemical solution deposition. A particular developable bottom anti-reflective coating layer 20 that is formed by the liquid deposition method comprises a polymer that includes at least one monomer unit comprising the formula M-R1 wherein M is at least one of C, Si, Ge, B, Sn, Fe, Ta, Ti, Ni, Hf and La and R1 is a chromophore. Alternatively, M may include at least one of Ge, B, Sn, Fe, Ta, Ti, Ni, Hf and La, either with or without Si and also independently with or without C.

In some particular embodiments, M within the monomer unit may also be bonded to an organic ligand including atoms of C and H, a cross-linking component or another chromophore, or combinations thereof. The organic ligand may further include at least one of O, N, S and F. When the organic ligand is bonded to M, the organic ligand is bonded to M through C, O, N, S.

In other particular embodiments, the developable bottom anti-reflective coating layer 20 formed by liquid deposition may also include at least one second monomer unit, in addition to the at least one monomer unit represented by the formula M-R1. When present, at least one second monomer unit has the formula M'-R2, wherein M' is at least one of C, Si, Ge, B, Sn, Fe, Ta, Ti, Ni, Hf and La, and R2 is a cross-linking agent. Alternatively, M' may include at least one of Ge, B, Sn, Fe, Ta, Ti, Ni, Hf and La, either with or without Si, and also independently with or without C. M and M' may be the same or different elements. In these two formulae, M and M' within the two separate monomer units may also be bonded to organic ligands including atoms of C and H, a cross-linking component, a chromophore or mixtures thereof. The organic ligands may further include one of O, N, S and F. When the organic ligand is bonded to M and M', it is bonded to M or M' through C, O, N, S.

The liquid developable bottom anti-reflective coating layer 20 compositions comprising M-R1, or M-R1 and M'-R2 may also comprise at least one additional component, including but not limited to a separate cross-linking monomer, an acid generator and/or a solvent.

In this particular embodiment, the developable bottom anti-reflective coating 20 formed by liquid deposition is desirably characterized by the presence of a stoichiometric or non-stoichiometric silicon oxide (i.e., SiO) containing polymer having pendant chromophore moieties. The silicon oxide containing polymer may be a polymer containing SiO moieties in the polymer backbone and/or in pendant groups. Preferably, the polymer contains SiO moieties in the polymer backbone. The polymer is preferably a siloxane, a silane, a carbosilane, an oxycarbosilane, an organosilicate, a silsesquioxane, or an organosiloxane, more preferably organosilsesquioxane. The polymer should have solution and film-forming characteristics conducive to forming the developable bottom anti-reflective coating layer 20 by conventional spin-coating. In addition to the chromophore moieties discussed above, the SiO-containing polymer also preferably contains a plurality of reactive sites distributed along the SiO containing polymer for reaction with a cross-linking component.

The first imageable inter-level dielectric layer 22 typically comprises an imageable dielectric material that has a comparatively low dielectric constant (i.e., from 1.0 to less than 4.3) either as initially deposited or as subsequently processed. Such an imageable dielectric material is also formed using a generally conventional deposition process including but not limited to spin-on-coating, spray coating, dip coating, brush coating, and evaporation. Subsequent to forming the first imageable inter-level dielectric layer 20, a post deposition baking step is optionally, but nonetheless typically, required to remove unwanted components, such as solvent based components. When performed, the baking step is conducted at a temperature from 60° to 200° C., with a baking temperature from 80° to 140° C. being even more preferred. The duration of such a baking process step varies, depending upon particular materials compositions, solvents and baking temperatures.

A thickness of the first imageable inter-level dielectric layer 22 may vary depending on the technique used to form the first imageable inter-level dielectric layer 22, as well as the material of composition of the first imageable inter-level dielectric layer 22. Typically, the first imageable inter-level dielectric layer 22 has a thickness from 10 to 10000 nanometers, with a thickness from 50 to 2000 nanometers being more typical.

As suggested above, the first imageable inter-level dielectric layer 22 first functions as a photoresist layer and may then optionally, if appropriate, be converted into a comparatively low dielectric constant material layer incident to post patterning processing. Examples of post processing include, but are not necessarily limited to, thermal treatment, ultraviolet light treatment, electron beam treatment, ion beam treatment, microwave treatment, plasma treatment, or combinations of the foregoing treatments. As an example, the first imageable inter-level dielectric layer 22 may comprise a functionalized polymer having one or more acid-sensitive groups that impart imageable characteristics to the first imageable inter-level dielectric layer 22. These polymers or blends of polymers can be converted into a comparatively low dielectric constant dielectric material after subsequent processing.

More specifically, the first imageable inter-level dielectric layer 22 comprises acid-sensitive (typically photo generated acid) polymers of hydrocarbons, fluorinated hydrocarbons, siloxane, silane, carbosilane, oxycarbosilane, organosilicates, silsesquioxanes and the like. The polymers include, for example, silsesquioxane-type polymers including caged, linear, branched or combinations thereof. In a particular sub-embodiment, the first imageable inter-level dielectric layer 22 comprises a blend of these acid-sensitive polymers. The first imageable inter-level dielectric 22 may further comprise at least one sacrificial pore generator to reduce the dielectric constant when forming the first imageable inter-level dielectric 22 in a cured form. Further examples of imageable inter-level dielectric materials that may be used for the first imageable inter-level dielectric layer 22 within the context of the instant embodiment are taught within U.S. Pat. Nos. 7,041,748, 7,056,840, and 6,087,064, the teachings of all of which are incorporated herein by reference in their entirety.

The first imageable inter-level dielectric layer 22 preferably has a dielectric constant after cure, generally no greater than 4.3. The dielectric constant may be greater than 1.0 and less than 4.3, more preferably from 1.0 to 3.6, even more preferably from 1.0 to 3.0, further more preferably from 1.0 to 2.5, with 1.0 to 2.0 being most preferred.

The first imageable inter-level dielectric layer 22 is preferably formed from a composition that includes one of the above mentioned polymers or polymer blends, a photoacid generator, a base additive and a solvent typically used in a photoresist type composition. The photoacid generators, base additives and solvents are generally conventional in the microelectronic fabrication art and will be discussed further below.

Within this particular embodiment, the first imageable inter-level dielectric layer 22 may comprise a negative-tone imageable inter-level dielectric material comprising a silsesquioxane polymer or copolymer including, for example, but not limited to, poly(methylsilsesquioxane) (PMS), poly(p-hydroxybenzylsilsesquioxane) (PHBS), poly(p-hydroxyphenylethylsilsesquioxane) (PHPES), poly(p-hydroxyphenylethylsilsesquioxane-co-p-hydroxy-alpha-methylbenzyl silsesquioxane) (PHPE/HMBS), poly(p-hydroxyphenylethylsilsesquioxane-co-methoxybenzylsilsesquioxane) (PHPE/MBS), poly(p-hydroxyphenylethylsilsesquioxane-co-t-butylsilsesquioxane) (PHPE/BS), poly(p-hydroxyphenylethylsilsesquioxane-co-cyclohexylsilsesquioxane) (PHPE/CHS), poly(p-hydroxyphenylethylsilsesquioxane-co-phenylsilsesquioxane) (PHPE/PS), poly(p-hydroxyphenylethylsilsesquioxane-co-bicycloheptylsilsesquioxane) (PHPE/BHS), poly(p-hydroxy-alpha-methylbenzylsilsesquioxane) (PHMBS), poly(p-hydroxy-alpha-methylbenzylsilsesquioxane-co-p-hydroxybenzylsilsesquioxane) (PHMB/HBS), poly(p-hydroxy-alpha-methylbenzylsilsesquioxane-co-methoxybenzylsilsesquioxane) (PHMB/MBS), poly(p-hydroxy-alpha-methylbenzylsilsesquioxane-co-t-butylsilsesquioxane) (PHMB/BS), poly(p-hydroxy-alpha-methylbenzylsilsesquioxane-co-cyclohexylsilsesquioxane) (PHMB/CHS), poly(p-hydroxy-alpha-methylbenzylsilsesquioxane-co-phenylsilsesquioxane) (PHMB/PS), poly(p-hydroxy-alpha-methylbenzylsilsesquioxane-co-bicycloheptylsilsesquioxane) (PHMB/BHS), poly(p-hydroxybenzylsilsesquioxane-co-p-hydroxyphenylethylsilsesquioxane) (PHB/HPES), and poly(p-hydroxy-alpha-methylbenzylsilsesquioxane-co-p-alpha-methylbenzylsilsesquioxane) (PHMB/MBS).

When the first imageable inter-level dielectric layer 22 comprises a blended polymer component, the silsesquioxane polymer in the blend may be selected from the silsesquioxane polymers described above or may be selected from other silsesquioxane polymers such as, for example, but not limited to poly(methyl-silsesquioxane) (PMS), poly(p-hydroxybenzylsilsesquioxane) (PHBS), poly(p-hydroxybenzylsilsesquioxane-co-methoxybenzylsilsesquioxane) (PHB/MBS), poly(p-hydroxy-alpha-methylbenzylsilsesquioxane-co-p-alpha-methylbenzylsilsesquioxane) (PHMB/MBS), poly(p-hydroxybenzylsilsesquioxane-co-t-butylsilsesquioxane) (PHB/BS), poly(p-hydroxybenzylsilsesquioxane-co-cyclohexylsilsesquioxane) (PHB/CHS), poly(p-hydrooxybenzylsilsesquioxane-co-phenylsilsesquioxane) (PHB/PS), poly(p-hydroxybenzylsilsesquioxane-co-bicycloheptylsilsesquioxane) (PHB/BHS), and caged silsesquioxanes such as octakis(glycidyloxypropyl)dimethylsilyloxy)silsesquioxane, octakis[cyclohexenyl epoxide) dimethylsilyloxy]silsesquioxane, octakis[4-(hydroxyphenylethyl)dimethylsilyloxy]silsesquioxane, and octakis[{2-(1',1'-bis(trifluoromethyl)-1'-hydroxyethyl) norbornyl}dimethylsilyloxy]silsesquioxane. If desired, a combination of different silsesquioxane polymers may be used in the blend with the non-silsesquioxane polymer.

Alternatively, for a positive tone first imageable inter-level dielectric layer 22 a silicon-containing polymer employed within a coating composition may include a homopolymer or a copolymer. Suitable types of such silicon-containing polymers include homopolymers or copolymers containing at least one monomer selected from the group consisting of a siloxane, a silane, a silsesquioxane and a silyne. Highly preferred silicon-backbone polymers are selected from the group consisting of poly(hydroxyphenyl alkyl)silsesquioxanes and poly(hydroxyphenyl alkyl)siloxanes, wherein the alkyl is a $C_{1-30}$ moiety. These preferred silicon-containing polymers are preferably fully or partially protected with acid-sensitive protecting groups.

The positive-tone material for forming the first imageable inter-level dielectric layer 22 may comprise blends of a non-silicon containing polymer and a silicon-containing polymeric additive with a silicon-containing substituent bonded to the polymeric backbone, the silicon-containing polymeric additive may be a homopolymer or copolymer containing at least one monomer having a silicon-containing substituent. The silicon-containing substituent may or may not be acid sensitive. Typically, however the substituent is acid sensitive when containing a $C_2$ alkyl moiety. Preferably, the silicon-containing substituent is attached to a monomer selected from the group consisting of hydroxystyrene, an acrylate, a methacrylate, an acrylamide, a methacrylamide, itaconate, an itaconic half ester or a cycloolefin. Preferred silicon-containing substituents include: siloxane, silane and cubic silsesquioxanes. The silicon-containing polymer may further include silicon-free monomers such as those selected from the group consisting of styrene, hydroxystyrene, acrylic acid, methacrylic acid, itaconic acid and an anhydride such as maleic anhydride and itaconic anhydride.

Preferred monomers containing silicon-containing substituents are trimethylsilyl alkyl acrylate, trimethylsilyl alkyl methacrylate, trimethylsilyl alkyl itaconate, tris(trimethylsilyl)silyl alkyl acrylate tris(trimethylsilyl)silyl alkyl methacrylate, tris(trimethylsilyl)silyl alkyl itaconate, tris(trimethylsilyloxy)silyl alkyl acrylate, tris(trimethylsilyloxy)silyl alkyl methacrylate, tris(trimethylsilyloxy)silyl alkyl itaconate, alkylsilyl styrene, trimethylsilylmethyl(dimethoxy)silyloxy alkyl acrylate, trimethylsilylmethyl(dimethoxy)silyloxy alkyl methacrylate, trimethylsilylmethyl(dimethoxy)silyloxy alkyl itaconate, trimethylsilyl alkyl norbornene-5-carboxylate alkyl, tris(trimethylsilyl)silyl alkyl norbornene-5-carboxylate and tris(trimethylsilyloxy)silyl alkyl norborene-5-carboxylate, wherein alkyl is a $C_{1-5}$ moiety.

Highly preferred species of these monomers are 3-(3,5,7, 9,11,13,15-heptacyclopentylpentacyclo[9.5.1.13,9.15, 15.17,13]-octasiloxan-1-yl)propyl methacrylate, 1,3,5,7,9, 11,13-heptacyclopentyl-15-vinylpentacyclo[9.5.1.13,9.15, 15.17,13]octasiloxane, methacrylamidotrimethylsilane, O-(methacryloxyethyl)-N-(triethoxysilylpropyl)urethane, methacryloxyethoxytrimethylsilane, N-(3-methacryloxy-2-hydroxypropyl)-3-aminopropyltriethoxysilane, (methacryloxymethyl)bis(trimethylsiloxy)methylsilane, (m,p-vinylbenzyloxy)trimethylsilane, methacryloxypropyltris (trimethylsiloxy)silane, methacryloxytrimethylsilane, 3-methacryloxypropylbis(trimethylsiloxy)methylsilane, 3-methacryloxypropyldimethylchlorosilane, methacryloxypropyldimethylethoxysilane, methacryloxypropyldimethylmethoxysilane, methacryloxypropylheptacyclopentyl-T8-silsequioxane, methacryloxypropylmethyldichlorosilane, methacryloxypropylmethyldiethoxysilane, methacryloxypropylmethyldimethoxysilane, (methacryloxymethyl)dimethylethoxysilane, (methacryloxymethyt)phenyldimethylsilane(phenyldimethylsilyl)methylmethacrylate, methacryloxymethyltriethoxysilane, methacryloxymethyltrimethoxysilane, methacryloxymethyltris(trimethylsiloxy) silane, O-methacryloxy(polyethyleneoxy)trimethylsilane, methacryloxypropylpentamethyldisiloxane, methacryloxypropylsilatrane, methacryloxypropylsiloxane macromer, methacryloxypropyl terminated polydimethylsiloxane, methacryloxypropyltrichlorosilane, methacryloxypropyltriethoxysilane, methacryloxypropyltrimethoxysilane, methacryloxypropyltris(methoxyethoxy)silane, p-(t-butyldimethylsiloxy)styrene, butenyltriethoxysilane, 3-butenyltrimethylsilane, (3-acryloxypropyl)trimethoxysilane, (3-acryloxypropyl)tris(trimethylsiloxy)silane, O-(trimethylsilyl)acrylate, 2-trimethylsiloxyethlacrylate, N-(3-acryloxy-2-hydroxypropyl)-3-aminopropyltriethoxysilane, (3-acryloxypropyl)dimethylmethoxysilane, (3-acryloxypropyl)methylbis(trimethylsiloxy)silane, (3-acryloxypropyl) methyldichlorosilane, and (3-acryloxypropyl)methyldimethoxysilane, (3-acryloxypropyl)trichlorosilane.

Within the instant embodiment, the extent of protection and the amount of co-monomer present in the silicon containing polymeric additive are such that the first imageable inter-level dielectric layer 22 will provide desirable lithography performance, i.e., high resolution and acceptable process window. Examples of protecting groups which may be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed in the present embodiment include, but are not limited to, phenolic carbonates; t-alkoxycarbonyloxys such as t-butoxylcarbonyloxy and isopropyloxycarbonyloxy. A highly preferred carbonate is t-butoxylcarbonyloxy.

Examples of cyclic and branched ethers that may be employed in the present embodiment include, but are not limited to, benzyl ether and t-alkyl ethers such t-butyl ether. Of the aforesaid ethers, it is highly preferred to use t-butyl ether.

Examples of cyclic and branched esters that can be employed in the present invention include, but are not limited to carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butyrlolactonyl ester, bis(trimethylsilyl)isopropyl ester, trimethylsilylethyl ester, tris(trimethylsilyl)silylethyl ester and cumyl ester.

Examples of acetals and ketals that can be employed in the present invention include, but are not limited to, phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed.

Illustrative examples of silylethers that can be employed in the present invention include, but are not limited to, trimethylsilylether, dimethylethylsilylether and dimethylpropylsilylether. Of these silylethers, it is preferred that trimethylsilylether be employed.

In a particular embodiment for a negative-tone first imageable inter-level dielectric layer 22 of the instant embodiment, two miscible, or compatible, silsesquioxane polymers are included. A first silsesquioxane polymer is a linear, branched, caged compound or combination thereof having the following structural formula:

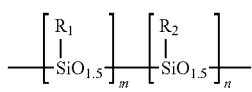

wherein each occurrence of $R_1$ is one or more acidic functional groups for base solubility; each occurrence of $R_2$ is a carbon functionality for controlling polymer dissolution in an aqueous base; $R_1$ is not equal to $R_2$; m and n represent the number of repeating units; m is an integer; and n is zero or an integer greater than zero. In the present embodiment, $R_1$ is not limited to any specific functional group, and is preferably selected from among linear or branched alkyls which are substituted with OH, C(O)OH, and/or F; cycloalkyls which are substituted with OH, C(O)OH, and/or F; aromatics which are substituted with OH, C(O)OH, and/or F; arenes that are substituted with OH, C(O)OH, and/or F; and acrylics which are substituted with OH, C(O)OH, and/or F.

Examples of preferred $R_1$ include:

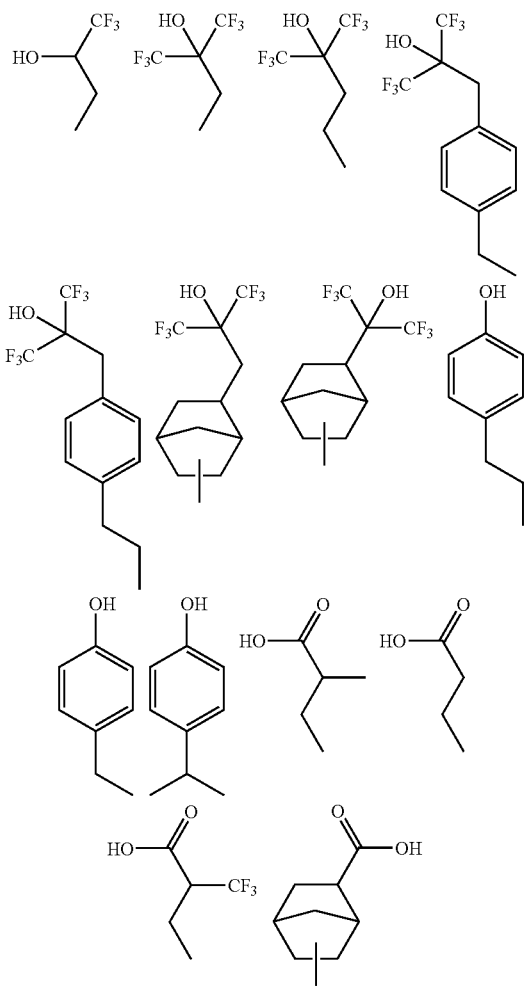

In the present embodiment, $R_2$ is not limited to any specific carbon functional group, and is preferably selected from among linear or branched alkyls, cylcoalkyls, aromatics, arenes, and acrylates.

The silsesquioxane polymers have a weight averaged molecular weight of 400 to 500,000 atomic mass units, and more preferable from 1500 to 10,000 atomic mass units. The $R_1$ and $R_2$ proportions and structures are selected to provide a material suitable for photolithographic processes, while also maintaining pattern fidelity after post patterning cure.

A second polymer component of the blend material includes but is not limited to a family of organosilicates known as silsesquioxanes, having the structural formula:

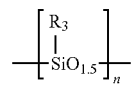

wherein $R_3$ is preferable selected from alkyls, cycloalkyls, aryl, or a combination thereof; and are commercially available from Dow Corning, Inc., Shin-Etsu, Inc., or JSR Corporation, for example. The silsesquioxane is preferably poly (methylsilsesquioxane), and n is an integer about 10 to about 1,000 or more (including copolymers). The silsesquioxane polymers possess silanol end groups, but may also include halosilanes, acetoxysilanes, silylamines, and alkoxysilanes. In a preferred embodiment of the present invention, silsesquioxane polymers, LKD-2021 or LKD-2056 (from JSR Corporation) which contain silanol end groups are employed.

The composition of the silsesquioxane polymers in the blend formulation is 1 to 99% of the total polymer composition. In the preferred embodiment of the invention, the composition of the acid sensitive polymer is 20 to 80% of the total polymer composition, and even more preferred, 30 to 60%.

A third component of the imageable first inter-level dielectric layer 22 of the present embodiment is a pore-generating compound, called a porogen. The porogen provides nanoscopic pores in the composition of matter of the present invention which further reduces the dielectric constant of the first imageable inter-level dielectric layer 22.

The porogen that can be used includes miscible or phase separated (i.e., non-miscible) polymers that are capable of decomposing under heat or radiation. Alternatively, the porogen may be extracted with supercritical fluid techniques. Examples of porogens that may be employed include, but are not limited to, homopolymers, copolymers, organic nanoscopic polymers, thermoplatic polymers, star-shaped polymers, dendrimers or crosslinked polymers that remain substantially dormant during the patterning process. After patterning, the pore generating polymers are decomposed or extracted to enhance the dielectric properties of the material of the present invention without severely degrading the pattern fidelity. The decomposition of the porogen may be by heat-induced or radiation-induced, or other methods may alternatively be used.

When a porogen is employed, the porogen is present in the composition in an amount of from 1 to 9 weight percent of the functionalized polymer. More preferably, the porogen is present in an amount of from 5 to 50 weight percent of the functionalized polymer.

A fourth component of the imageable first inter-level dielectric layer 22 is a photosensitive acid generator (PAG) that is compatible with the other components. Non-limiting examples of preferred photosensitive acid generators include -(trifluoro-methylsulfonyloxy)-bicyclo[2.2.1]hept-5-ene-2, 3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,371,605. The content of the '605 patent is incorporated herein by reference. A weaker acid generated from a photosensitive acid generator such as N-hydroxy-naphthalimide (DDSN) may be used. Combinations of photosensitive acid generators may be used.

Condensation in the presence of an acid generated by a photoacid generator under exposure to radiation is not limited to silanols, but may also include halosilanes, acetoxysilanes, silylamines, and alkoxysilanes. Organic crosslinking agents, such as methylphenyltetramethoxymethyl glycouril(methylphenyl powderlink), may also be included in the formulation. Although photoacid generators are preferred for crosslinking, photobase generators can also be used for crosslinking silanol polymers.

The material from which is formed the first imageable inter-level dielectric layer 22 of the instant embodiment may also include a casting solvent to dissolve the other components. Non-limiting examples of suitable casting solvent include, but are not limited to, ethoxyethylpropionate (EEP), a combination of EEP and γ-butyrolactone, propylene-glycol monomethylether alcohol and acetate, propyleneglycol monopropyl alcohol and acetate, and ethyl lactate. Combinations of these solvents may also be used.

In optimizing a photolithography process, an organic base may be added to the composition for forming the first imageable inter-level dielectric layer 22. The base employed may be any suitable base known in the resist art. Examples of bases include tetraalkylammonium hydroxides, cetyltrimethylammonium hydroxide, and 1,8-diaminonaphthalene. The compositions used in this disclosure are not limited to any specific selection of base.

The term "acid-sensitive" is used throughout the application to denote imageable functional groups which undergo a chemical reaction in the presence of an acid generated by a photoacid generator under exposure to actinic imaging radiation. The acid-sensitive imageable functional groups employed in the present invention may include acid-sensitive positive-tone functional groups or acid-sensitive negative-tone functional groups. The negative-tone acid-sensitive functional groups are functional groups for causing a crosslinking reaction which causes the exposed areas to be insoluble in a developer to form a negative-tone relief image after development. The positive-tone acid-sensitive functional groups are acid-sensitive protecting groups which cause the exposed region to be soluble in a developer to form positive-tone relief images after development.

The aforementioned first imageable inter-level dielectric layer 22 uses materials that act as a photoresist for patterning; which may be positive-tone or negative-tone, and sensitive to G-line, I-line, DUV (248 nm, 193 nm, 157 nm, 126 nm, and EUV (13.4 nm) radiation sources.

Figure 4:
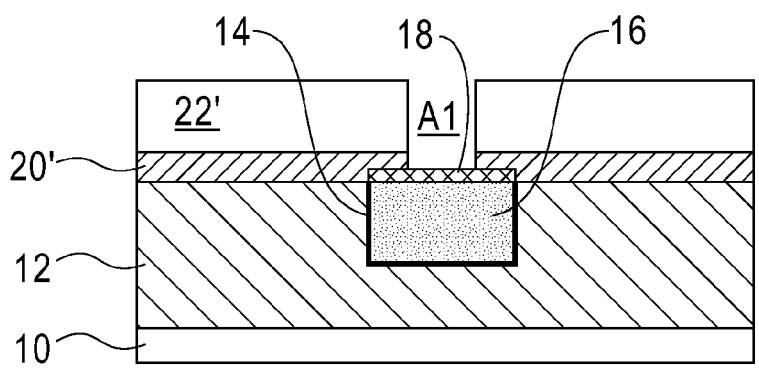

FIG. 4 shows the results of imaging and developing the first imageable inter-level dielectric layer 22 to provide a patterned first inter-level dielectric layer 22' and developing the developable bottom anti-reflective coating 20 to form a patterned bottom anti-reflective coating 20', which in an aggregate provide a damascene aperture A1. Such imaging and developing may be effected using methods and materials that are otherwise generally conventional in the microelectronic fabrication art, in particular as is appropriate to a particular tone of the first imageable inter-level dielectric layer 22.

Figure 5:
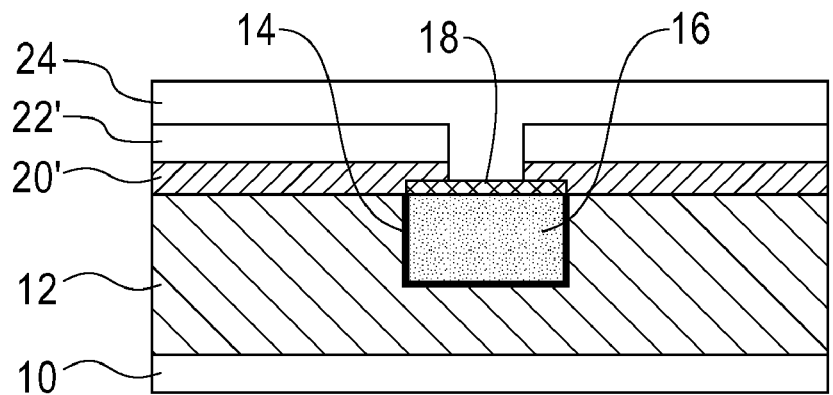

FIG. 5 shows a second imageable inter-level dielectric layer 24 located and formed upon the microelectronic structure of FIG. 4. The second imageable inter-level dielectric layer 24 may comprise an imageable inter-level dielectric material analogous, equivalent or identical to the imageable inter-level dielectric material from which may be comprised the first imageable inter-level dielectric layer 22 that is illustrated in FIG. 3. Within the context of the instant embodiment, to provide the microelectronic structure of FIG. 5, the first patterned inter-level dielectric layer 22' will typically comprise a negative tone imageable inter-level dielectric material while the second imageable inter-level dielectric layer 24 may comprise either a positive tone or a negative tone imageable inter-level dielectric material. Typically the second imageable inter-level dielectric layer 24 has a thickness from 50 to 2000 nanometers.

Figure 6:
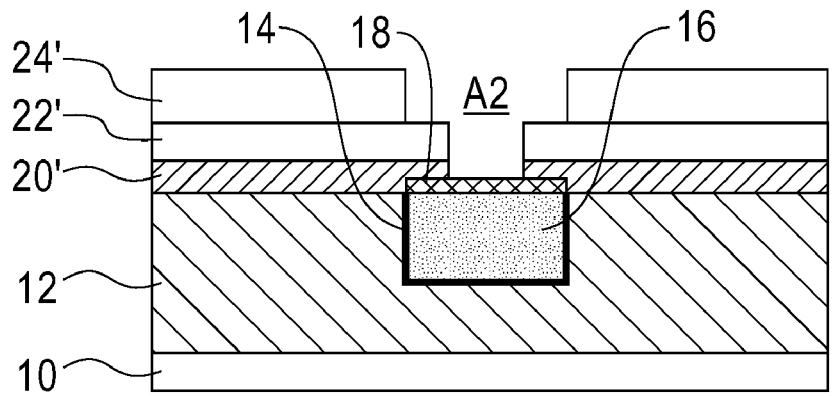

FIG. 6 shows the results of imaging and developing the second imageable inter-level dielectric layer 24 to form a second patterned inter-level dielectric layer 24' which in conjunction with the first patterned inter-level layer 22' and the patterned bottom anti-reflective coating layer 20' provide a dual damascene aperture A2 from the damascene aperture A1. Imaging and developing of the second imageable inter-level dielectric layer 24 to form the second patterned inter-level dielectric layer 24' may be effected using photolithographic exposure and development methods and materials that are otherwise generally conventional in the microelectronic fabrication art, and otherwise analogous, equivalent or identical to the methods and materials that are used for forming the patterned first inter-level dielectric layer 22' that is illustrated in FIG. 4 from the first imageable inter-level dielectric layer 22 that is illustrated in FIG. 3.

Figure 7:
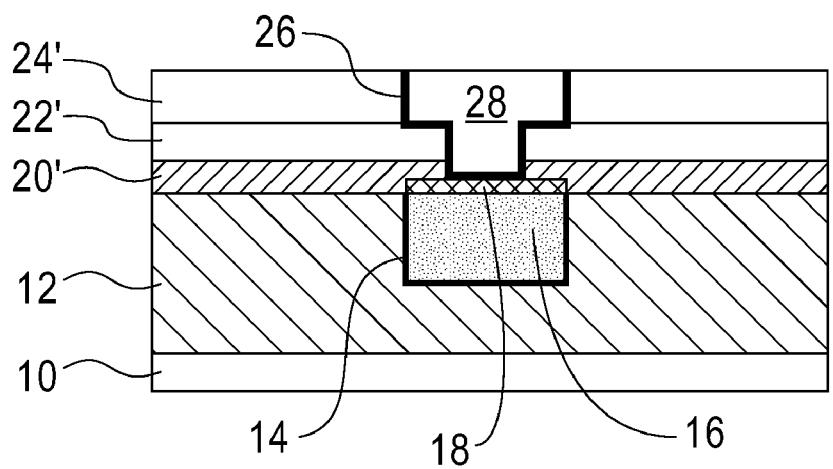

FIG. 7 shows a second barrier layer 26 located and formed within the dual damascene aperture A2 that is illustrated in FIG. 6. FIG. 7 also shows a second conductor layer 28 located and formed upon the second barrier layer 26.

Within this particular embodiment, the second barrier layer 26 and the second conductor layer 28 may comprise materials, have dimensions and be formed using methods that are otherwise generally conventional in the microelectronic fabrication art. Such methods, materials and dimensions may also correspond with the methods, materials and dimensions that are used when fabricating the first barrier layer 14 and the first conductor layer 16.

FIG. 7 shows a schematic cross-sectional diagram of a microelectronic structure in accordance with a particular embodiment of the invention.

The particular microelectronic structure in accordance with the particular embodiment includes the substrate 10 that further includes thereover the first conductor layer 16 embedded within the base dielectric layer 12. The first capping layer 18 is located and formed aligned upon the first conductor layer 16. The microelectronic structure also includes a patterned bottom anti-reflective coating layer 20', a first patterned inter-level dielectric layer 22' and a second patterned inter-level dielectric layer 24' that in an aggregate comprise and define a dual damascene aperture A2 into which is located and formed a second barrier layer 26 and then a second conductor layer 28.

Within the microelectronic structure whose schematic cross-sectional diagram is illustrated in FIG. 7, the patterned bottom anti-reflective coating layer 20' includes an element selected from the group consisting of C, Si, Ge, B, Sn, Fe, Ta, Ti, Ni, Hf and La. In addition, each of the patterned first inter-level dielectric layer 20' and the patterned second inter-level dielectric layer 22' comprises at least one organic functionalized silicon containing dielectric material. Within the context of the disclosure above, the microelectronic structure whose schematic cross-sectional diagram is illustrated in FIG. 7 may be fabricated absent dry plasma etch processing.

The preferred embodiment of the invention is illustrative of the invention rather than limiting of the invention. Revisions and modifications may be made to methods, materials, structures and dimensions of a microelectronic structure in accordance with the preferred embodiment, while still providing a microelectronic structure in accordance with the invention, further in accordance with the accompanying claims.

What is claimed is:

1. A method for fabricating a microelectronic structure comprising:
   forming a developable but not imageable bottom anti-reflective coating layer over a substrate that includes a first conductor layer formed within a base dielectric layer;
   forming at least one imageable inter-level dielectric layer upon the developable but not imageable anti-reflective coating layer, said at least one imageable inter-level dielectric layer comprising a functionalized polymer having one or more acid-sensitive functional groups; and
   imaging and developing the imageable inter-level dielectric layer and developing the developable but not imageable bottom anti-reflective coating layer to form a patterned inter-level dielectric layer formed upon a patterned bottom anti-reflective coating layer that defines an aperture located over the first conductor layer.

2. The method of claim 1 wherein the forming over the substrate uses a dielectric substrate.

3. The method of claim 1 wherein the forming over the substrate uses a semiconductor substrate.

4. The method of claim 1 wherein the aperture comprises a damascene aperture.

5. The method of claim 1 wherein the aperture comprises a dual damascene aperture.

6. The method of claim 1 further comprising forming a second conductor layer within the aperture.

7. The method of claim 1 wherein the developable but not imageable bottom anti-reflective coating layer includes an element selected from the group consisting of C Si, Ge, B, Sn, Fe, Ta, Ti, Ni, Hf and La.

8. A method for fabricating a microelectronic structure comprising:
   forming a first capping layer self-aligned upon a first conductor layer formed within a base dielectric layer formed over a substrate;
   forming a developable but not imageable bottom anti-reflective coating layer over the substrate that includes the first capping layer formed upon the first conductor layer formed within the base dielectric layer;
   forming at least one imageable inter-level dielectric layer upon the developable but not imageable bottom anti-reflective coating layer, said at least one imageable inter-level dielectric layer comprising a functionalized polymer having one or more acid-sensitive functional groups; and
   imaging and developing the at least one imageable inter-level dielectric layer and developing the developable but not imageable bottom anti-reflective coating layer to form a patterned inter-level dielectric layer formed upon a patterned bottom anti-reflective coating layer that defines an aperture located over the first conductor layer.

9. The method of claim 8 wherein the first conductor layer is formed planarized with respect to the base dielectric layer.

10. The method of claim 8 wherein the first capping layer is formed planarized with respect to the base dielectric layer.

11. The method of claim 8 further comprising forming a second conductor layer into the aperture.

12. The method of claim 8 wherein the developable but not imageable bottom anti-reflective coating layer includes an element selected from the group consisting of C Si, Ge, B, Sn, Fe, Ta, Ti, Ni, Hf and La.

13. The method of claim 1 wherein the developable but not imageable bottom anti-reflective coating layer comprises a polymer that includes at least one monomer unit comprising the formula M-R1 wherein M is at least one of C, Si, Ge, B, Sn, Fe, Ta, Ti, Ni, Hf and La, and R1 is a chromophore.

14. The method of claim 8 wherein the developable but not imageable bottom anti-reflective coating layer comprises a polymer that includes at least one monomer unit comprising the formula M-R1 wherein M is at least one of C, Si, Ge, B, Sn, Fe, Ta, Ti, Ni, Hf and La, and R1 is a chromophore.

15. The method of claim 1 wherein the developable but not imageable bottom anti-reflective coating layer comprises a polymer that includes at least one first monomer unit comprising the formula M-R1 wherein M is at least one of C, Si, Ge, B, Sn, Fe, Ta, Ti, Ni, Hf and La, and R1 is a chromophore, and a second monomer unit comprising the formula M'-R2 wherein M' is at least one of C, Si, Ge, B, Sn, Fe, Ta, Ti, Ni, Hf and La and R2 is a cross-linking agent.

16. The method of claim 8 wherein the developable but not imageable bottom anti-reflective coating layer comprises a polymer that includes at least one first monomer unit comprising the formula M-R1 wherein M is at least one of C, Si, Ge, B, Sn, Fe, Ta, Ti, Ni, Hf and La, and R1 is a chromophore, and a second monomer unit comprising the formula M'-R2 wherein M' is at least one of C, Si, Ge, B, Sn, Fe, Ta, Ti, Ni, Hf and La and R2 is a cross-linking agent.

* * * * *